United States Patent
Ishihara (10) Patent No.: US 8,030,753 B2
(45) Date of Patent: Oct. 4, 2011

(54) SEMICONDUCTOR DEVICE AND METHOD FOR MAKING THE SAME

(75) Inventor: Takayuki Ishihara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 136 days.

(21) Appl. No.: 12/535,277

(22) Filed: Aug. 4, 2009

(65) Prior Publication Data

US 2010/0032707 A1   Feb. 11, 2010

(30) Foreign Application Priority Data

Aug. 7, 2008 (JP) .................................. 2008-203869

(51) Int. Cl.
*H01L 33/00* (2010.01)
*H01L 23/482* (2006.01)

(52) U.S. Cl. .......... 257/698; 257/99; 257/692; 257/700; 257/E33.062; 257/E23.016

(58) Field of Classification Search .................... 257/99, 257/692, 698, 700, E33.062, E23.016
See application file for complete search history.

(56) References Cited

U.S. PATENT DOCUMENTS

| | | | | |
|---|---|---|---|---|
| 5,656,548 A * | 8/1997 | Zavracky et al. | ............... | 438/23 |
| 6,847,275 B2 * | 1/2005 | Sayanagi et al. | ............... | 333/247 |
| 7,319,243 B2 * | 1/2008 | Kim | ............................ | 257/98 |
| 7,834,375 B2 * | 11/2010 | Andrews | ...................... | 257/100 |
| 7,834,461 B2 * | 11/2010 | Asai et al. | ..................... | 257/774 |
| 2004/0012030 A1 * | 1/2004 | Chen et al. | ..................... | 257/99 |
| 2006/0160260 A1 * | 7/2006 | Cho et al. | ........................ | 438/30 |
| 2009/0256170 A1 * | 10/2009 | Shakuda | ........................ | 257/99 |
| 2010/0032694 A1 * | 2/2010 | Kim et al. | ..................... | 257/88 |

FOREIGN PATENT DOCUMENTS

JP  2006-287263  10/2006
JP  2008-16537  * 1/2008

* cited by examiner

*Primary Examiner* — Victor A Mandala (74) *Attorney, Agent, or Firm* — Hamre, Schumann, Mueller & Larson, P.C.

(57) ABSTRACT

A semiconductor device includes a semiconductor element, an electrode formed on the semiconductor element, and a protective member covering the semiconductor element. The protective member is formed with a through-hole facing the electrode. In the through-hole, a wiring pattern is formed to be electrically connected to the electrode.

5 Claims, 7 Drawing Sheets

SEMICONDUCTOR DEVICE AND METHOD FOR MAKING THE SAME

BACKGROUND OF THE INVENTION

1. Field of the Invention

The present invention relates to a semiconductor device and a method for making a semiconductor device.

2. Background of the Art

Figure 14:
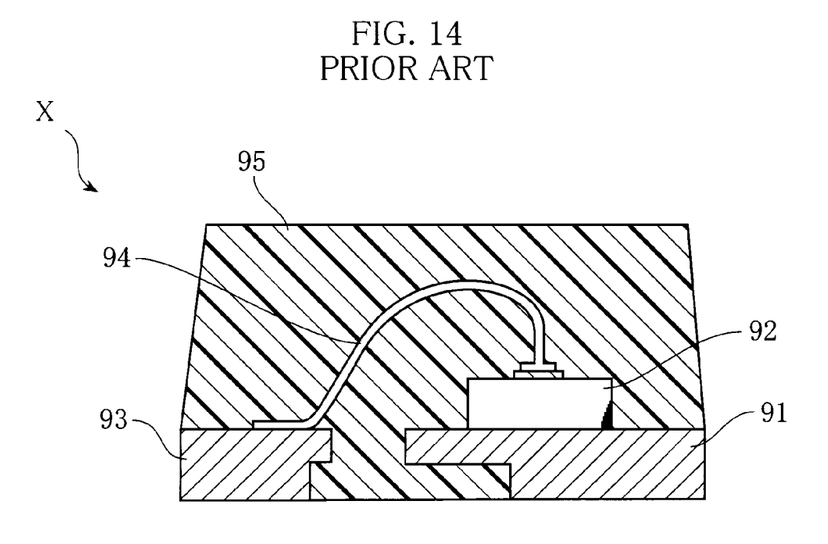
FIG. 14 is a sectional view showing an example of conventional semiconductor device.

FIG. 14 shows an example of conventional semiconductor device (see JP-A-2006-287263). The illustrated semiconductor device X includes a first lead 91, a semiconductor chip 92 mounted on the first lead 91, a second lead 93, a wire 94 and a resin package 95. While mostly enclosed by the resin package 95, each of the leads 91, 93 is partially exposed so as to function as a connecting terminal of the semiconductor device X. The semiconductor chip 92 is provided with an upper electrode and a lower electrode (not shown). The upper electrode is connected to the second lead 93 via the wire 94, while the lower electrode is connected directly (i.e., without using a wire) to the first lead 91.

In the above semiconductor device X, the wire 94 is used for connecting the semiconductor chip 92 to the second lead 93. Unfavorably, such a wire may be flattened or even broken in the manufacturing process, for example. Further, the wire connecting process adds to time in the manufacturing procedure, which is disadvantageous for improving the production efficiency.

SUMMARY OF THE INVENTION

According to a first aspect of the present invention, there is provided a semiconductor device comprising: a semiconductor element; an electrode formed on the semiconductor element; a protective member covering the semiconductor element and formed with a through-hole facing the electrode; and a wiring pattern formed in the through-hole and electrically connected to the electrode.

Preferably, the semiconductor device according to the first aspect of the present invention may further comprise an insulating substrate, and first and second electrode pads formed on an obverse surface of the substrate. The semiconductor element is mounted on the first electrode pad. The protective member exposes at least part of the second electrode pad. The wiring pattern extends on an outer surface of the protective member and is electrically connected to the second electrode pad.

Preferably, the semiconductor device according to the first aspect of the present invention may further comprise an insulating substrate, an electrode pad, a first mount electrode, and a second mount electrode. The electrode pad is formed on an obverse surface of the substrate. The first mount electrode is formed on a reverse surface of the substrate and electrically connected to the electrode pad, while the second mount electrode is formed on an outer surface of the protective member and electrically connected to the wiring pattern. The semiconductor element is mounted on the electrode pad.

Preferably, the semiconductor device according to the first aspect of the present invention may further comprise an additional semiconductor element covered by the protective member. The protective member is formed with an additional through-hole facing the additional semiconductor element, and the wiring pattern extends in the additional through-hole to be electrically connected to the additional semiconductor element.

Preferably, the semiconductor element may be an LED chip, and the protective member may be made of a material that transmits light emitted from the LED chip.

According to a second aspect of the present invention, there is provided a method for making a semiconductor device. The method comprises: preparing a semiconductor element provided with an electrode; forming a protective member for covering the electrode and the semiconductor element; forming a through-hole in the protective member for exposing the electrode; and forming a wiring pattern in the through-hole, the wiring pattern being electrically connected to the electrode.

Preferably, the through-hole may be formed by irradiating the protective member with a laser beam.

Other features and advantages of the present invention will become more apparent from detailed description given below with reference to the accompanying drawings.

DETAILED DESCRIPTION OF THE PREFERRED EMBODIMENTS

Figure 1:
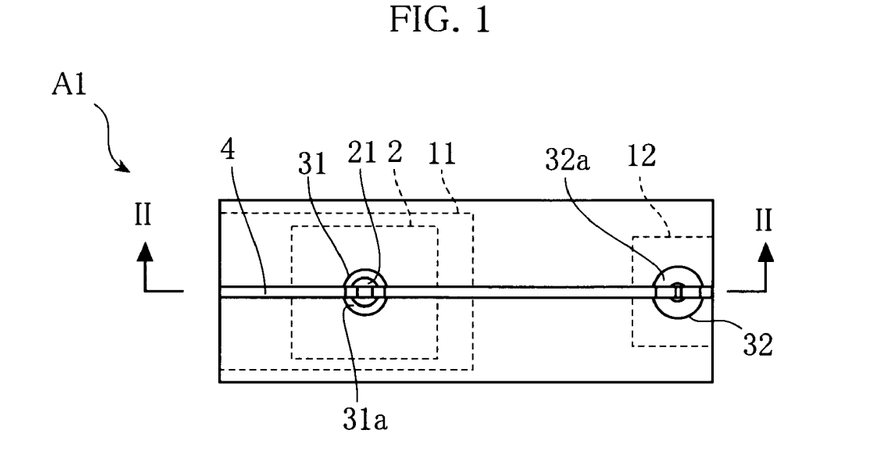
FIG. 1 is a plan view showing a semiconductor device according to a first embodiment of the present invention.
Figure 2:
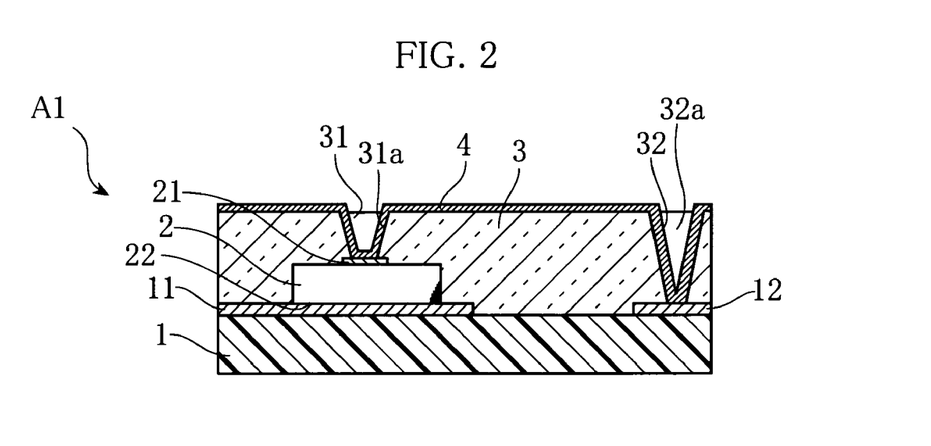
FIG. 2 is a sectional view taken along lines II-II in FIG. 1.

FIG. 1 shows a semiconductor device according to a first embodiment of the present invention in plan view. FIG. 2 is a sectional view taken along lines II-II in FIG. 1. The semiconductor device A1 shown in FIGS. 1 and 2 is a light source device including a substrate 1, an LED chip 2, a protective member 3 and a wiring pattern 4.

The substrate 1, made of e.g. a glass fiber-reinforced epoxy resin, is in the form of a plate having a thickness of e.g. 0.1 mm. The substrate 1 has an obverse surface formed with a pair of electrode pads 11 and 12 spaced from each other. The electrode pads 11 and 12 are made of e.g. Cu. The electrode pads 11 and 12 are provided at two ends of the substrate 1 in the longitudinal direction and electrically connected to electrode terminals for external connection.

The LED chip 2 is an example of semiconductor element of the present invention and mounted on the electrode pad 11 via Ag paste. The LED chip 2 has an obverse surface and a reverse surface provided with electrodes 21 and 22 made of Cu. The electrode 22 is electrically connected to the electrode pad 11. The LED chip 2 is adapted to emit e.g. visible light. The total thickness of the LED chip 2 and the electrode pad 11 is about e.g. 0.1 mm.

The protective member 3 is made of e.g. a resin which transmits visible light and covers the obverse surface of the substrate 1 and the LED chip 2. The distance between the obverse surface of the substrate 1 and the upper surface of the protective member 3 is e.g. about 0.2 mm. The protective member 3 includes, on the upper surface side, a through-hole 31 facing (corresponding in position to) the electrode 21, and a through-hole 32 facing the electrode pad 12. The inner surface 31a of the through-hole 31 is an inclined surface connecting the upper surface of the protective member 3 and the electrode 21 to each other. The inner surface 32a of the through-hole 32 is an inclined surface connecting the upper surface of the protective member 3 and the electrode pad 12 to each other.

The wiring pattern 4 is made of e.g. Cu. As shown in FIG. 1, the wiring pattern 4 is formed on the upper surface of the protective member 3, the inner surface 31a of the through-hole 31 and the inner surface 32a of the through-hole 32 to extend in the longitudinal direction of the semiconductor device A1. As shown in FIG. 2, the wiring pattern 4 is electrically connected to the electrode 21 and the electrode pad 12.

A method for making the semiconductor device A1 will be described below with reference to FIGS. 3-8.

Figure 3:
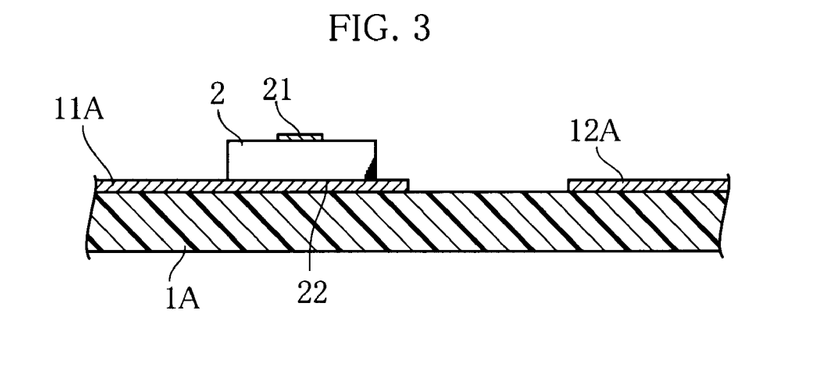
FIG. 3 is a sectional view showing the step of mounting an LED chip.

First, an elongate substrate 1A having an obverse surface formed with conductor layers 11A and 12A is prepared. The conductor layers 11A and 12A are made of e.g. Cu and spaced from each other. A plating layer of e.g. Ni or Au may be formed on the Cu surface. Then, as shown in FIG. 3, an LED chip 2 is mounted on the conductor layer 11A. In the mounting process, Ag paste is applied to the conductor layer 11A, and then the LED chip 2 is placed onto the Ag paste.

Figure 4:
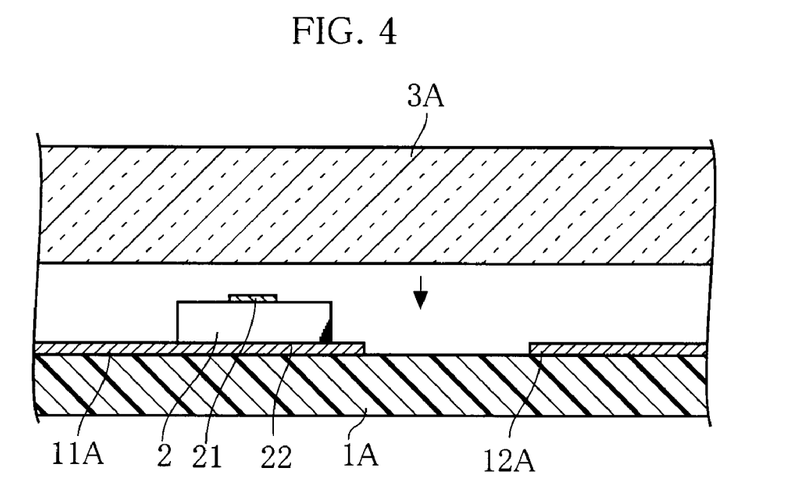
FIG. 4 is a sectional view showing the step of bonding transparent resin to a substrate.
Figure 5:
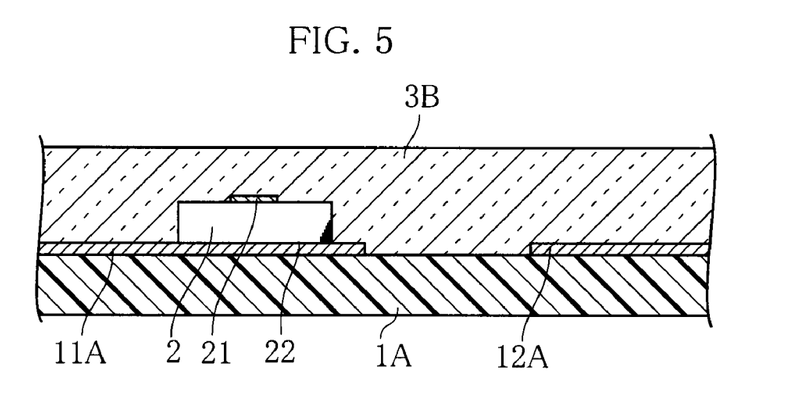
FIG. 5 is a sectional view showing the step of forming a protective layer on the substrate.

Then, as shown in FIGS. 4 and 5, a protective member 3 is formed for covering the electrode 21 of the LED chip 2. Specifically, in a vacuum, transparent resin 3A in the form of a sheet is pressed against the obverse surface of the substrate 1A while being heated. As a result, a protective layer 3B covering the obverse surface of the substrate 1A and the LED chip 2 is obtained. The protective layer 3B will be cut later to become a protective member 3. The protective layer 3B is formed to have a thickness of about 0.2 mm at a portion which does not overlap the LED chip 2.

Figure 6:
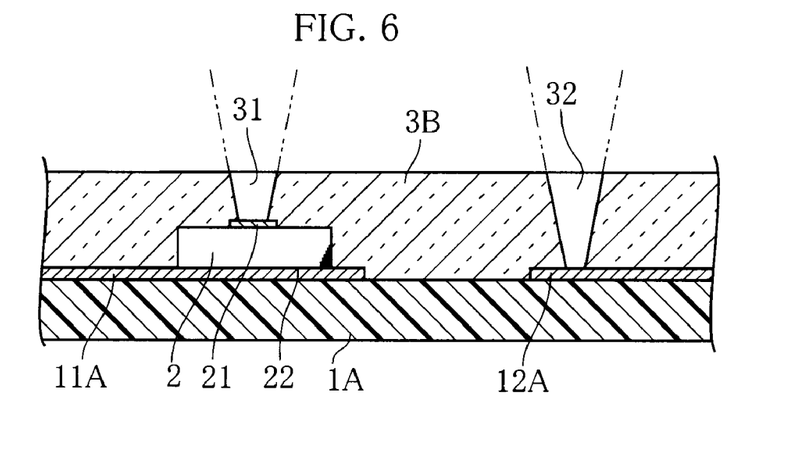
FIG. 6 is a sectional view showing the step of forming a through-hole in the protective layer.

Then, as shown in FIG. 6, through-holes 31 and 32 are formed in the protective layer 3B to expose the electrode 21 and the conductor layer 12A. The through-holes may be formed by irradiating predetermined portions of the upper surface of the protective layer 3B with a YAG laser beam. Specifically, the through-hole 31 is formed by irradiating the upper surface of the protective layer 3B at a portion directly above the electrode 21 with a laser beam. The through-hole 32 is formed by irradiating the upper surface of the protective layer 3B at a portion directly above the conductor layer 12A with a laser beam. Since the electrode 21 and the conductor layer 12A are made of Cu, these parts readily reflect a YAG laser beam, which is suitable for forming the through-holes 31 and 32.

Figure 7:
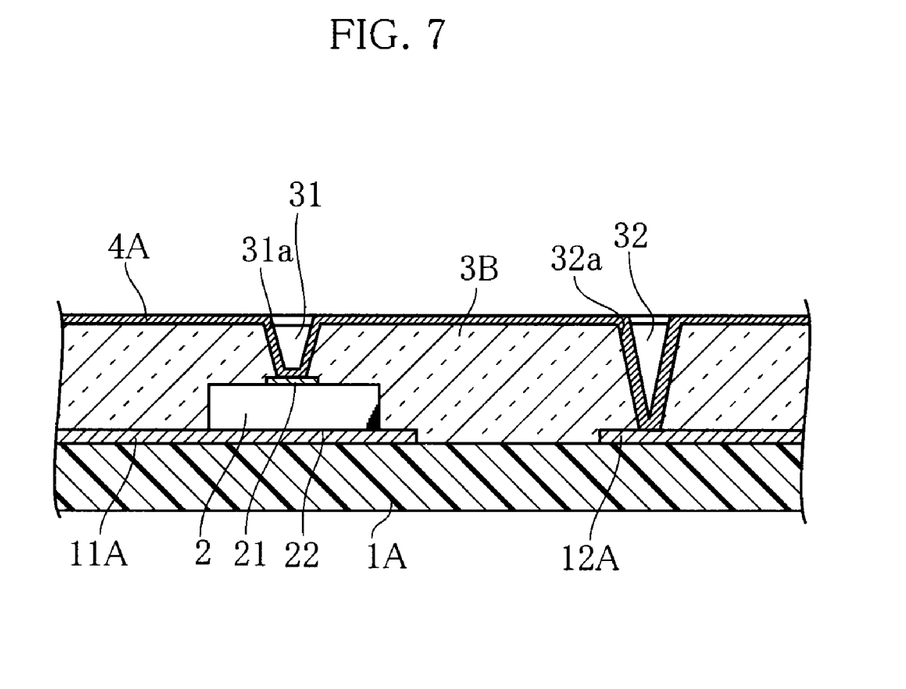
FIG. 7 is a sectional view showing the step of forming a metal plating layer on the protective layer.
Figure 8:
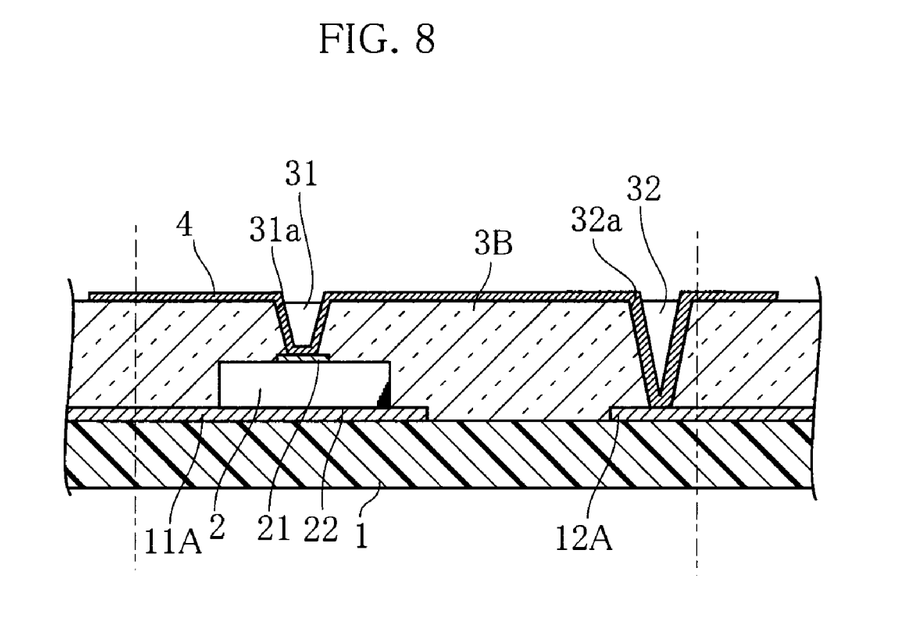
FIG. 8 is a sectional view showing the step of forming a wiring pattern.

Then, as shown in FIGS. 7 and 8, a wiring pattern 4 is formed on the inner surfaces of the through-holes 31 and 32. In this process, a metal plating layer 4A is first formed on the upper surface of the protective layer 3B and the inner surfaces 31a, 32a of the through-holes 31, 32, as shown in FIG. 7. The metal plating layer 4A may be formed by plating Cu into a thickness of e.g. 18 μm.

Then, patterning is performed with respect the metal plating layer 4A, and a wiring pattern 4 is obtained. The patterning may be performed by providing a resist and removing exposed portions.

Then, cutting is performed along the phantom lines shown in FIG. 8, whereby the semiconductor device A1 as shown in FIGS. 1 and 2 is obtained. By this cutting, the substrate 1A is divided into substrates 1, the conductor layers 11A, 12A into electrode pads 11, 12, and the protective layer 3B into protective members 3.

The advantages of the semiconductor device A1 will be described below.

According to the above embodiment, the electrode 21 and the electrode pad 12 are electrically connected to each other via the wiring pattern 4 formed on the protective member 3, which makes the provision of a wire unnecessary. Accordingly, the process for manufacturing a semiconductor device is simplified, and no defect due to the breakage of a wire is produced. Moreover, since no wire is provided, the thickness of the protective member 3 can be reduced.

The protective member 3 of this embodiment is easily formed by pressing transparent resin 3A in the form of a sheet against the substrate 1A and later cutting the sheet. The protective member 3 can be formed easily also by applying transparent resin 3A in a liquid state to the substrate 1A.

According to this embodiment, the wiring pattern 4 is easily formed by patterning the metal plating layer 4A. Since the wiring pattern 4A is less likely to be damaged than a wire, the reliability of the semiconductor device A1 is enhanced. The wiring pattern 4 itself can be used as a terminal for external connection, which facilitates the incorporation of the semiconductor device A1 into e.g. a circuit.

According to the above embodiment, the inner surfaces 31a, 32a of the through-holes 31, 32 are inclined, so that the metal plating layer 4A on the inner surfaces 31a, 32a is formed easily.

FIGS. 9-13 show other embodiments of the present invention. In these figures, the elements identical or similar to those of the foregoing embodiment are designated by the same reference signs as those used for the foregoing embodiment, and the description is omitted.

Figure 9:
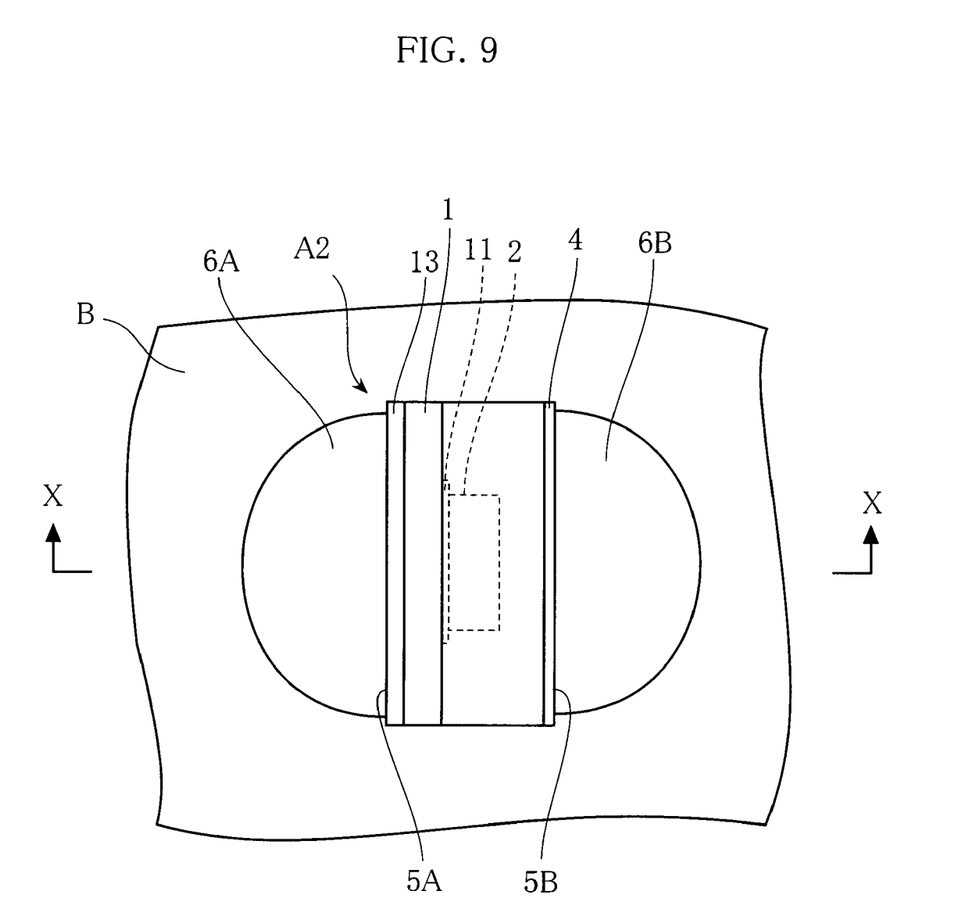
FIG. 9 is a plan view of a semiconductor device according to a second embodiment of the present invention.
Figure 10:
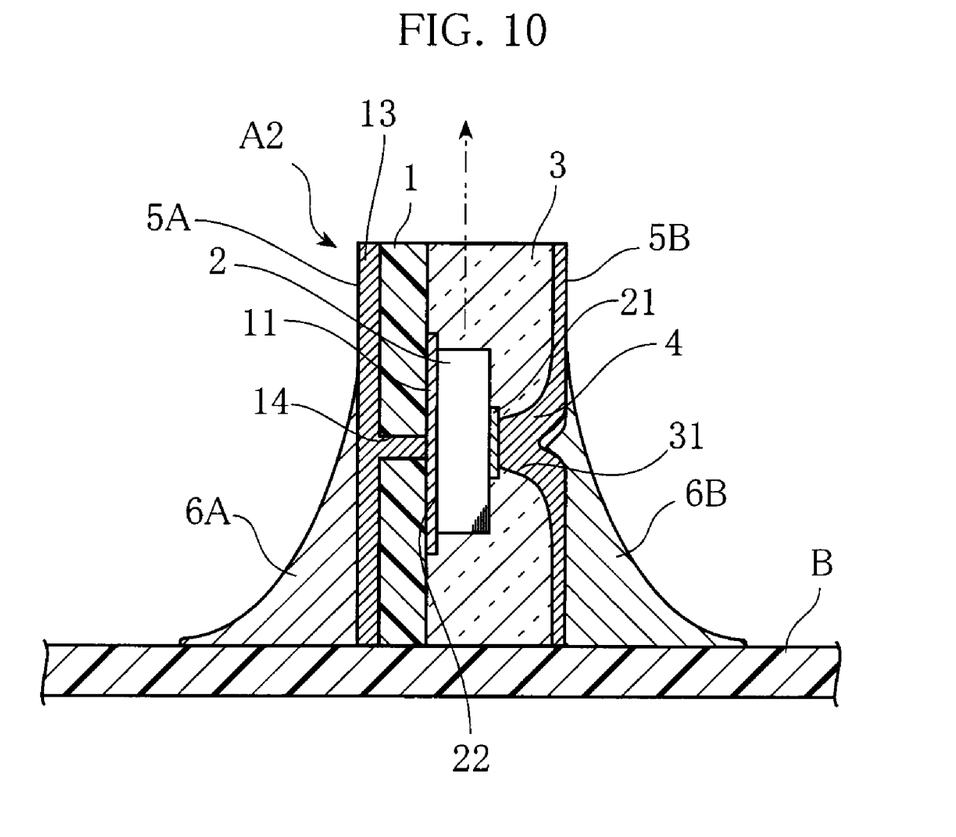
FIG. 10 is a sectional view taken along lines X-X in FIG. 9.

FIGS. 9 and 10 show a semiconductor device according to a second embodiment of the present invention in a state mounted on a mounting board B. The semiconductor device A2 shown in FIGS. 9 and 10 includes mount electrode surfaces 5A and 5B standing on the mounting board B and is adapted to emit light in the direction indicated by the arrow of phantom lines in FIG. 10. The mount electrode surfaces 5A, 5B are bonded to the mounting board B via solder 6A, 6B and electrically connected to a wiring pattern on the mounting board B via the solder 6A, 6B.

In the semiconductor device A2, the substrate 1 is arranged to stand upright on the mounting board B, and the reverse surface of the substrate 1 is formed with a metal layer 13. The substrate 1 is further formed with a through-hole 14. The metal layer 13 and the electrode pad 11 are electrically connected to each other via the through-hole 14. The outer surface of the metal layer 13 is the mount electrode surface 5A.

The wiring pattern 4 of the semiconductor device A2 is in the form of a film covering the protective member 3. The obverse surface of the film is the mount electrode surface 5B. The wiring pattern 4 may be formed by grinding a preformed metal plating layer 4A into the prescribed pattern.

Similarly to the semiconductor device A1, the semiconductor device A2 does not require a wire, so that the process for manufacturing the semiconductor device is simplified, and no defect due to the breakage of a wire is produced. Further, since no wire is provided, the thickness of the protective member 3 can be reduced.

By applying the solder 6A, 6B to the mount electrode surfaces 5A, 5B, which have a relatively large area, the semiconductor device A2 is fixed to the mounting board B easily and firmly.

Figure 11:
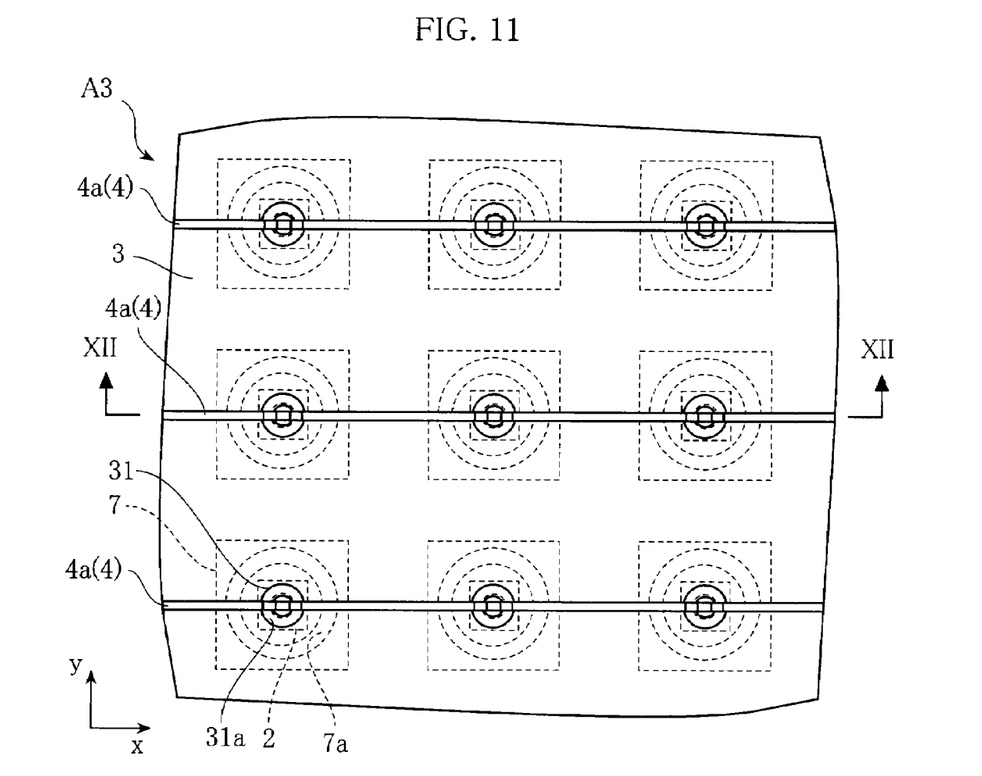
FIG. 11 is a plan view of a semiconductor device according to a third embodiment of the present invention.
Figure 12:
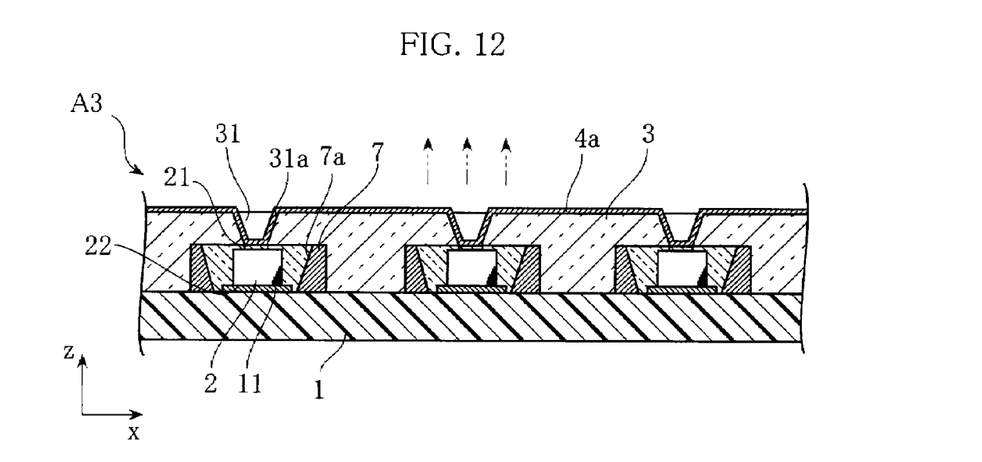
FIG. 12 is a sectional view taken along lines XII-XII in FIG. 11.

FIGS. 11 and 12 show part of a semiconductor device according to a third embodiment of the present invention. The semiconductor device A3 shown in FIGS. 11 and 12 is a dot matrix array including a plurality of LED chips 2 arranged in the x and y directions perpendicular to each other.

The wiring pattern 4 of the semiconductor device A3 includes a plurality of strips 4a extending in the x direction and spaced from each other in the y direction. Each of the strips 4a is formed on the upper surface of the protective member 3 and the inner surfaces 31a of the through-holes 31 to be electrically connected to the electrodes 21 of the LED chips 2 arranged in the x direction. In the semiconductor device A3, the substrate 1 is formed with a wiring pattern (not shown). The wiring pattern of the substrate 1 includes a plurality of strips extending in the y direction and spaced from each other in the x direction.

The semiconductor device A3 further includes a plurality of reflectors 7 each of which surrounds a respective one of the LED chips 2. Each of the reflectors 7 includes a reflective surface 7a which reflects the light emitted from the side surface of the LED chip 2 upward in the z direction. The reflectors 7 may not be provided when the LED chips 2 emit a sufficient amount of light.

In the semiconductor device A3, since the LED chips 2 arranged in the x direction and the y direction are connected to each other not by a wire but by the wiring pattern 4, the distance between the LED chips 2 can be made relatively small. Specifically, when the LED chips 2 are to be connected to each other via a wire, the LED chips 2 need to be spaced from each other by at least about 0.75 mm. However, this embodiment ensures that the distance between the LED chips 2 is reduced to about 0.3 mm. Moreover, since the semiconductor device A3 does not use a wire, a defect due to the breakage of a wire is not produced.

Thus, the semiconductor device A3 achieves high-density arrangement of the LED chips 2 while simplifying the manufacturing process, which may lead to the provision of a display with a high image quality.

Figure 13:
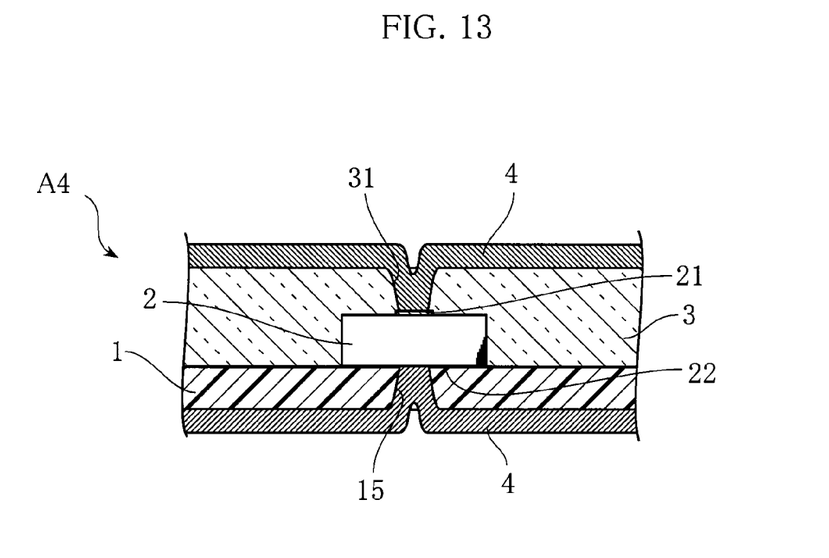
FIG. 13 is a sectional view showing a principal portion of a semiconductor device according to a fourth embodiment of the present invention.

FIG. 13 is a sectional view illustrating a semiconductor device according to a fourth embodiment of the present invention. In the semiconductor device A4 shown in FIG. 13, the LED chip 2 is not mounted on an electrode pad 11 on a substrate 1. Instead, the substrate 1 is formed with a through-hole 15 facing the electrode 22 on the reverse surface of the LED chip 2, and a wiring pattern 4 is formed also on the reverse surface of the substrate 1 and the inner surface of the through-hole 15. Similarly to the through-hole 13, the through-hole 15 can be formed easily using a YAG laser beam. The electrode 22 made of Cu is suitable for the use of a YAG laser beam.

Similarly to the semiconductor device A1, the semiconductor device A4 does not require a wire, so that the manufacturing process is simplified, and a defect due to the breakage of a wire is not produced. Moreover, since a wire is not provided, the thickness of the protective member 3 can be reduced.

Further, in manufacturing the semiconductor device A4, it is not necessary to form conductor layers 11A and 12A on the substrate 1A.

The semiconductor device according to the present invention is not limited to the foregoing embodiments. The specific structure of each part of the semiconductor device according to the present invention may be varied in design in many ways. For instance, the protective member 3 may be made of a prepreg, instead of the above-described transparent resin 3A. A prepreg may be formed in the manner described in JP-A-2005-60680. Specifically, microfibrillar cellulose (MFC) is fixed in water, and a Nano MFC sheet is formed through a grinding process and a film formation process. Then, the MFC sheet is impregnated with a varnish containing an epoxy resin.

According to the present invention, the semiconductor element is not limited to an LED chip. When the semiconductor element is not adapted to emit light, the protective member may be made of an opaque material.

The invention claimed is:

1. A semiconductor device comprising:
a semiconductor element;
an electrode formed on the semiconductor element;
a protective member covering the semiconductor element and formed with a through-hole facing the electrode;
a wiring pattern formed in the through-hole and electrically connected to the electrode;
an insulating substrate; and
first and second electrode pads formed on an obverse surface of the substrate;
wherein the semiconductor element is mounted on the first electrode pad, the protective member exposes at least part of the second electrode pad, and the wiring pattern extends on an outer surface of the protective member and is electrically connected to the second electrode pad.

2. A semiconductor device comprising:
a semiconductor element;
an electrode formed on the semiconductor element;
a protective member covering the semiconductor element and formed with a through-hole facing the electrode;
a wiring pattern formed in the through-hole and electrically connected to the electrode;
an insulating substrate;
an electrode pad;
a first mount electrode; and
a second mount electrode,
wherein the electrode pad is formed on an obverse surface of the substrate, the first mount electrode is formed on a reverse surface of the substrate and electrically connected to the electrode pad, the second mount electrode is formed on an outer surface of the protective member and electrically connected to the wiring pattern, and the semiconductor element is mounted on the electrode pad.

3. The semiconductor device according to claim 1, wherein the semiconductor element is an LED chip, and the protective member is made of a material that transmits light emitted from the LED chip.

4. A method for making a semiconductor device, the semiconductor device comprising a semiconductor element, an electrode formed on the semiconductor element, a protective member covering the semiconductor element and formed with a through-hole facing the electrode, a wiring pattern formed in the through-hole and electrically connected to the electrode, an insulating substrate, and first and second electrode pads formed on an obverse surface of the substrate, wherein the semiconductor element is mounted on the first electrode pad the protective member exposes at least part of the second electrode pad, and the wiring pattern extends on an outer surface of the protective member and is electrically connected to the second electrode pad, the method comprising:

- mounting the semiconductor element on the first electrode pad with the electrode directed away from the first electrode pad;
- forming the protective member for covering the electrode, the semiconductor element and the second electrode pad;
- forming a first through-hole in the protective member for exposing the electrode;
- forming a second through-hole in the protective member for exposing the second electrode pad; and
- forming the wiring pattern that extends in the first through-hole and the second through-hole, the wiring pattern being electrically connected to the electrode and the second electrode pad.

5. The method according to claim 4, wherein each of the first through-hole and the second through-hole is formed by irradiating the protective member with a laser beam.

* * * * *